United States Patent [19]
Wells et al.

[11] Patent Number: 5,473,753
[45] Date of Patent: Dec. 5, 1995

[54] METHOD OF MANAGING DEFECTS IN FLASH DISK MEMORIES

[75] Inventors: Steven E. Wells, Citrus Heights; Eric J. Magnusson, Orangevale; Robert N. Hasbun, Shingle Springs, all of Calif.

[73] Assignee: Intel Corporation, Santa Clara, Calif.

[21] Appl. No.: 969,749

[22] Filed: Oct. 30, 1992

[51] Int. Cl.⁶ ............................ G06F 11/00; G11C 29/00
[52] U.S. Cl. ..................................... 395/182.03; 365/218
[58] Field of Search .......................... 371/13, 10.1, 10.2, 371/12, 7, 8.1; 365/218; 395/182.03

[56] References Cited

U.S. PATENT DOCUMENTS

| | | | |
|---|---|---|---|
| 3,648,255 | 3/1972 | Beausoliel et al. | 340/172.5 |
| 4,641,310 | 2/1987 | Martens | 371/13 X |
| 4,763,305 | 8/1988 | Kuo | 365/200 |
| 4,802,117 | 1/1989 | Chrosny et al. | 364/900 |
| 4,896,262 | 1/1990 | Wayama et al. | 364/200 |
| 4,931,997 | 6/1990 | Mitsuishi | 365/218 |
| 5,070,474 | 12/1991 | Tuma et al. | 395/500 |
| 5,077,737 | 12/1991 | Leger et al. | 371/10.1 |
| 5,084,843 | 1/1992 | Mitsuishi | 365/218 |
| 5,131,089 | 7/1992 | Cole | 395/500 |
| 5,199,033 | 3/1993 | McGeoch et al. | 371/10.1 |
| 5,200,959 | 4/1993 | Gross et al. | 371/21.6 |
| 5,210,867 | 5/1993 | Barlow | 395/575 |
| 5,267,242 | 11/1993 | Lavallee | 371/10.1 |
| 5,270,979 | 12/1993 | Harari | 365/218 |
| 5,297,148 | 3/1994 | Harari | 371/10.2 |

FOREIGN PATENT DOCUMENTS

| | | | |
|---|---|---|---|
| 2088442 | 1/1993 | Canada | 13/16 |
| 0175458A2 | 3/1986 | European Pat. Off. . | |
| 0392895 | 10/1990 | European Pat. Off. | 16/6 |
| 2251324 | 7/1992 | United Kingdom . | |
| 2251323 | 7/1992 | United Kingdom . | |

OTHER PUBLICATIONS

Solid–State Mass Storage Arrives, Product Feature, Memory Card Systems & Design, Jul./Aug. 1992.

*Primary Examiner*—Robert W. Beausoliel, Jr.
*Assistant Examiner*—Glenn Snyder
*Attorney, Agent, or Firm*—Blakely, Sokoloff, Taylor & Zafman

[57] ABSTRACT

A method for monitoring the operations of a flash memory array divided into individually erasable blocks of memory in order to assure the integrity of data stored in the array in which each read or write operation is verified to detect an error which may have occurred in the operation including the steps of attempting at least one retry operation whenever an error occurs to determine whether the error is repeatable, marking the block to indicate valid data should be removed from the block if the error is found to be repeatable, removing the valid information from the block if the error is found to be repeatable, and removing a block with a repeatable error from operation.

10 Claims, 6 Drawing Sheets

```
                    PARITY
         1  1  0  1 | 1
         1  1  1  1 | 0
         0  0  1  0 | 1
         1  0  0  0 | 1
PARITY   1  0  0  0
```

METHOD OF MANAGING DEFECTS IN FLASH DISK MEMORIES

BACKGROUND OF THE INVENTION

1. Field of the Invention

This invention relates to computer memory arrangements and, more particularly, to methods for managing defects which occur during the operation of flash electrically erasable programmable read only memory (flash EEPROM) arrays.

2. History of the Prior Art

Modern computer systems make extensive use of long term memory. Typically this memory is provided by one or more hard (fixed) disks. A hard disk is an electro-mechanical device which includes one or more flat circular disks fixed to rotate rapidly about a central axis. Each flat disk has opposite surfaces which are coated with some form of magnetic material. A mechanical arm driven by electrical signals places a magnetic head over each side of each disk to write to positions on the disk or to read from those positions. These positions lie in sectors, a number of which (e.g., seventeen) form one complete track on one side of a disk. Each sector is capable of storing a fixed amount of data which is typically 512 bytes (256, 1024 or larger byte sectors are used in some disks). Depending on formatting, a single side of a disk may have over six hundred tracks. A typical disk drive used in personal computers today is capable of storing forty megabytes of data.

Such disk drives are very useful and have become almost a necessity to the operation of personal computers. However, such electro-mechanical drives do have their drawbacks. They are relatively heavy and increase the weight of a computer, especially a portable computer, significantly. They also are relatively bulky and require a significant amount of space within a computer. Their use requires a significant amount of the power and in a portable computer leads to significant battery power consumption. More importantly, electro-mechanical hard disk drives are very susceptible to shock. A hard drive within a portable computer which is dropped is quite likely to cease functioning. This can cause a catastrophic loss of data.

Recently, forms of long term storage other than electro-mechanical hard disks have become feasible for use in computers. One of these forms of long term storage is called flash EEPROM. Flash EEPROM memory is comprised of a large plurality of floating-gate metal-oxide-silicon field effect transistors arranged as memory cells in typical row and column fashion with circuitry for accessing individual cells and placing the memory transistors of those cells in one of two memory conditions. A flash memory cell, like a typical EPROM cell but in contrast to DRAM memory, retains information when power is removed. A flash EEPROM array has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk.

A peculiarity of flash EEPROM is that it is erased by applying a high voltage simultaneously to the source terminals of all of the transistors (cells) used in the memory (or some sub-portion). Because these source terminals are all connected to one another by metallic busing in the array, the entire portion must be erased at once. While an electro-mechanical hard disk will typically store information in a first area of the disk and then rewrite that same area of the disk when the information changes, this is not possible with a flash memory array without erasing all of the valid information that remains in the array along with the invalid (dirty) information.

Because of this, a different arrangement is used for programming and erasing sectors of a flash EEPROM array. First, the entire array is divided into smaller separately erasable blocks so that when a block is erased the amount of valid data which must be reprogrammed is reduced. Then, when the information at a data entry changes, the changed information is written to a new sector on an available block rather than written over the old data; and the old data is marked dirty. When erasure occurs, all of the valid data in the block to be erased is written to a new block; and then the dirty block is erased and put back into use as a clean block of memory. Because of this involved erasure process, it typically takes as much as two seconds to erase a flash EEPROM array. However, because erasure need not occur with each entry which is rewritten, erasure may be delayed until a block contains a sufficient amount of dirty information so that erasure is feasible. This reduces the number of erasure operations to a minimum and allows erasure to occur in the background when the facilities for controlling the array are not otherwise occupied with reading and writing.

The requirement for free space to write to when data changes and when a block having dirty sectors is erased means that space in the data array must be available for these purposes at all times or the array will not function. This places a heavy burden on the management of the space available in the flash EEPROM memory array.

As with other memory arrangements, failures of flash EEPROM memory arrays can occur; and means must be provided for dealing with such failures as they occur. Certain apparent failures which flash memory arrays may experience are, in fact, typical of the operation of transistor memory devices. Many of these failures are not, in fact, failures of the memory devices or of the array. Consequently, to disable the array or a section of the array on the occurrence of such errors would be to disable circuitry capable of continued use. This is especially undesirable in memory such as flash memory which continually uses free space for writing and erasure operations. Other failures are such that some part of the array is no longer usable and should be taken out of use, preserving the data therein as well as possible. For this reason, it is desirable that the various types of failures which appear to occur in a flash memory array be handled in a manner which preserves the data stored in the array by the host while at the same time preserving the array itself for further operation.

SUMMARY OF THE INVENTION

It is, therefore, an object of the present invention to provide a method for controlling the response of flash memory arrangements to defects detected in the operation of the flash memory array.

It is another more specific object of the present invention to provide a method by which the treatment of apparent defects in blocks of flash memory may be managed rationally.

These and other objects of the present invention are realized in a flash memory array divided into individually erasable blocks of memory by a method for monitoring the operations of the array in order to assure the integrity of data stored comprising the steps of checking each read or write operation to detect an error which may have occurred in the operation, attempting at least one retry operation whenever an error occurs to determine whether the error is repeatable, marking the block to indicate valid data should be removed from the block if more than one error which is not redundant occurs on the block, removing the valid information from the block if more than one such error occurs on the block, and removing a block with repeating errors from use.

These and other objects and features of the invention will be better understood by reference to the detailed description which follows taken together with the drawings in which like elements are referred to by like designations throughout the several views.

Notation And Nomenclature

Figure 1:
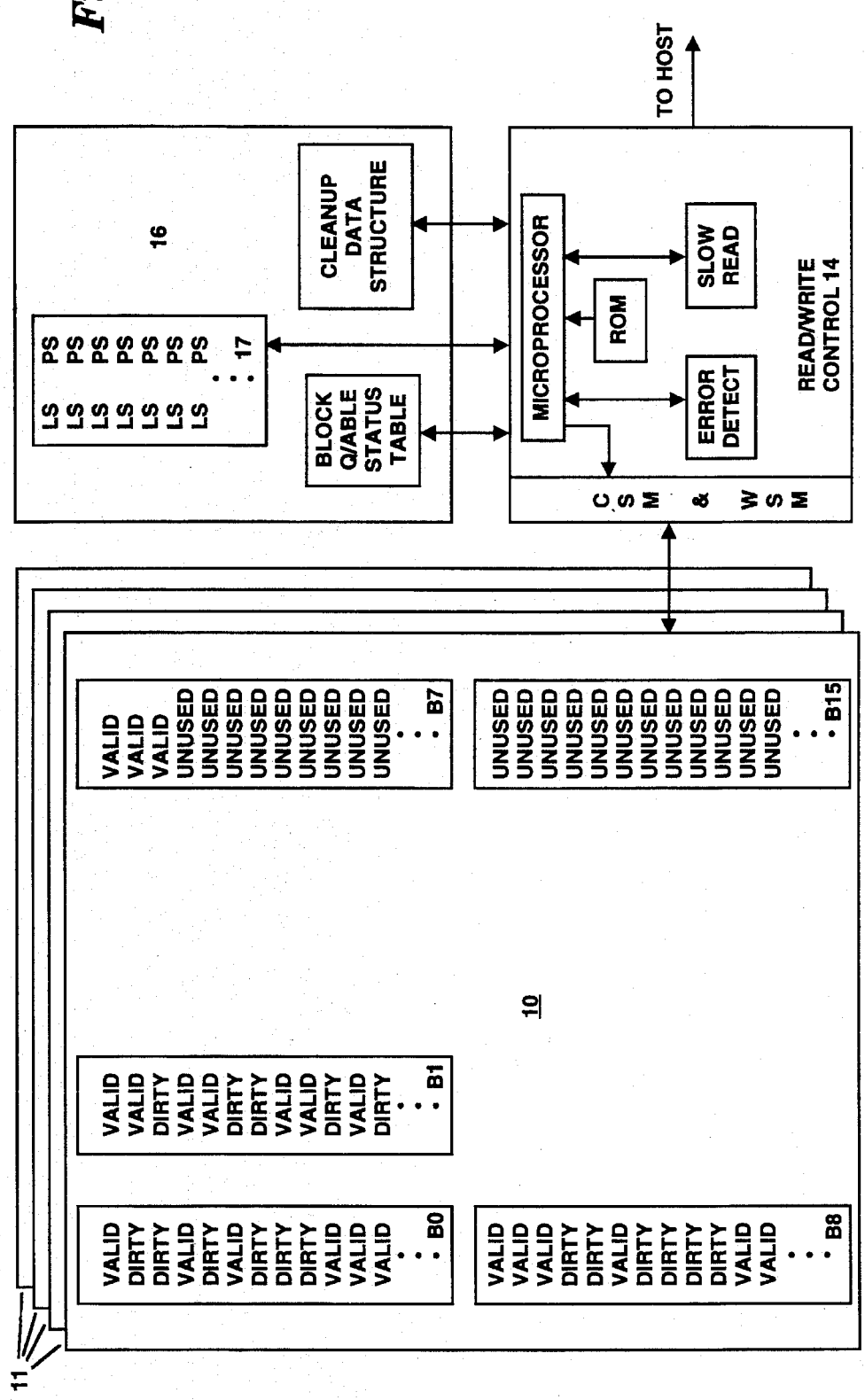
FIG. 1 is a block diagram illustrating the layout of a flash memory array in which the present invention may be utilized.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities.

Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer or a portion thereof and the method of computation itself should be borne in mind. The present invention relates to apparatus and to method steps for operating a computer in processing electrical or other (e.g. mechanical, chemical) physical signals to generate other desired physical signals.

DETAILED DESCRIPTION

As outlined above, flash EEPROM memory is comprised of a large plurality of transistors arranged as memory cells in an array with circuitry for accessing individual cells and placing the memory transistors of those cells in one of two memory conditions. A flash memory cell, like a typical EPROM cell, retains information when power is removed. However, unlike the typical EPROM cell, a flash EEPROM cell may be electrically programmed in place.

A difficulty with flash EEPROM is that it is not reprogrammable until it has been erased. Flash EEPROM is erased by applying a high voltage to the source terminals of all of the transistors used in the memory. Because these source terminals are all connected by metallic busing in the array, the entire array (or some sub-portion) must be erased at once. While an electro-mechanical hard disk will typically store information in a first area of the disk and then rewrite that same area of the disk when the information changes, this is not possible with flash EEPROM memory without erasing all of the valid information that remained in the erased portion of the array along with the invalid (dirty) information. This requires that all valid information be rewritten to the array each time the array is erased. Since the erase process requires the rewriting of all valid data in the portion erased, the erase process is quite slow; it typically requires between one and two seconds to erase a flash EEPROM array. Such an erase time would seem to preclude the use of flash EEPROM for rapidly changing data.

However, flash EEPROM may be used for long term storage where data is rapidly changing as is the case with the information typically stored by an electro-mechanical hard disk, if some method of erasing and rewriting the flash array is devised which is different than that typically used for electro-mechanical hard disks and does not slow the overall operation of the system.

A new arrangement for erasing and rewriting a flash EEPROM array is disclosed is U.S. patent application Ser. No. 07/969,131, filed Oct. 30, 1992, entitled *Method and Circuitry for a Solid State Memory Disk*, S. Wells, filed on even date herewith, and assigned to the assignee of the present invention. In that arrangement, a typical long term storage array is comprised of flash memory arranged in a series of blocks, each of which blocks is independently erasable. In one embodiment, the array is divided into a number of silicon chips each of which is subdivided into sixteen subblocks. Each subblock is, in fact, physically paired with a subblock on another of the silicon chips to create a logical block of the array in which odd bytes of data are stored on the subblock of one chip and even bytes of data are stored on the subblock of the other chip. Each of the logical blocks of flash memory is separately erasable from all other such blocks. However, each of the logical blocks of the array typically holds 128 kilobytes of data, sufficient to hold 256 sectors of information normally stored on the tracks of an electro-mechanical hard disk drive. Thus, a thirty chip flash memory array with sixteen individually-erasable subblocks per chip holds about the same amount of data as does a thirty megabyte electro-mechanical hard disk. Even with this division of data into 240 individually-erasable blocks, erasure of a block effects erasure of such a very large amount of information that to attempt to erase all of the data and then replace the valid data by rewriting each sector would be a practical impossibility.

In order to overcome this problem, in the new arrangement referred to above, data is written to any physical block of the flash memory array which has space available. Thus, data is written to an empty position in the array no matter what the apparent address of the data or the address on the block. A piece of data is written to the next available sector of the block being written, and a lookup table is kept which records the physical position on the block with the logical address. This arrangement of the array allows a first block to be written sector by sector, a second block to be written in the same sequential manner, and so on. When the data in a sector changes so that the sector needs to be rewritten, the data is written to a new physical position, the data in the lookup table is changed to record the new physical position along with the logical sector number, and the first position at which the data was written is marked as dirty. After some period of time, a sufficient number of blocks will be filled that it will be desirable to release space by moving the valid information from some especially dirty block to some other block and erasing the entire block from which the valid information has been moved. This has the effect of freeing up an additional number of sectors equal to all of the sectors on the erased block which have previously been marked as dirty.

An especial advantage of the arrangement is that it allows the erasure of blocks to occur in the background. That is, erasure may be arranged to occur when the facilities of the array are not otherwise occupied with reading and writing. In this manner, the external host which is writing to and receiving information from the flash array is typically not aware that an erasure is taking place even though the erasure requires one or two seconds.

Referring now to FIG. 1, there is illustrated in block diagram form a flash EEPROM memory array 10 in which the present invention may be practiced. The array 10 includes a plurality of blocks B0–B15 of flash EEPROM memory. Each block includes floating-gate field effect transistor memory cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here.

Flash memory is essentially an EPROM array with facilities provided so that entire array (or an individually erasable block) may be erased by a high voltage value applied simultaneously to the source terminals of all the memory transistors of the array. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage required for erasure. Since the source terminals of all of the memory transistors are joined together, a cell in a zero state remains in that state until the entire array is erased once again.

In the array 10 of FIG. 1, blocks B0–B15 of memory are illustrated positioned on a first chip 11 of the array 10. Additional silicon chips 11 (e.g., thirty) each hold additional blocks of the array 10 to provide a total of 240 blocks in one embodiment. In that embodiment, any block is actually constructed of a pair of subblocks which may be positioned on adjacent chips. The subblocks have input, output, and selection conductors such that odd bytes of data are stored in one subblock and even bytes of data on the other subblock. From this point on in this description, a block may be considered to include such a pair of subblocks.

Once any one of the blocks has been erased, data may be written to any position on the entire block. The operations of reading, writing, and erasing the array 10 are controlled by a control circuit 14 which receives commands and data from the host. The control circuit 14 includes among other things a microprocessor and read only memory which may store processes for operating the microprocessor to accomplish the various control operations described in this specification. The microprocessor and read only memory are used to carry out the processes in accordance with the present invention. For the purpose of this invention, the control circuit 14 may also be considered to include a command state machine and a write state machine. Although discussed as a part of the control circuit 14, in one embodiment the command state machine and the write state machine are physically a part of each chip 11.

The command state machine provides a command interface between the control circuit 14 and the flash EEPROM memory array. The command state machine controls the transfer of all data sent to and from the flash memory array. The command state machine sequences the data transferred from the host (using the write state machine) and to the host so that the writing to and reading from the array occur in proper order. A command state machine and a write state machine used for these purposes are described in detail in U.S. patent application Ser. No. 07/655,643, entitled Command State Machine, Fandrich et al, filed Feb. 11, 1991, and assigned to the assignee of the present invention, and in U.S. patent application Ser. No. 07/654,375, entitled Circuitry and Method For Programming and Erasing A Non-volatile Semiconductor Memory, Kynett et al, filed Feb. 11, 1991, and assigned to the assignee of the present invention.

When a host begins writing data to be stored in the array to some block of the array which has been completely erased, the data to be stored is written sequentially, sector by sector, to that block until that block has been filled with data. Then writing proceeds to the next sequential block having free space. At any point after writing is completed, the information may be read back from the array 10 by interrogating the block and sector at which the data is stored.

In accordance with the arrangement described above, the data is stored in logical sectors which are similar to the physical sectors utilized in storing data on the typical electro-mechanical hard disks of the prior art except that the sectors may be of any size (as will be explained below). When the data in a sector changes, the changed data is written to a new empty sector on some one of the blocks of the array 10, typically the next empty sector in physical sequence. This, rather than writing over the old information, occurs because the old information can only be rewritten if the entire block on which it is stored is erased. Consequently, the new information is written to a new position on an unfilled block (e.g., block B7), and the old position is marked invalid (dirty) by writing zeroes with the data stored (in a manner to be explained below) to indicate that the data is invalid. It will be recognized that a value of zero may be written to any memory cell without erasing the block of the array.

Because of the arrangement by which data is replaced, the sector number which is used to indicate where data is stored is a logical sector number rather than a physical sector number. This should be contrasted with the physical sector number used to arrange data on the typical electro-mechanical hard disk. In order to allow this to occur, a lookup table 17 (which is stored in a part of a random access memory 16 associated with the controller 14) is utilized with the array 10 so that the physical position in the array 10 at which any particular logical sector exists may be determined.

Also, because of this arrangement by which data is replaced, each block of the array will after some time have a number of entries which are marked dirty and cannot be used for storage. Consequently, the array 10 fills with data as the data previously stored is changed; and a point will come when it is necessary to clear the dirty information from a block in order to provide space for new or changed information to be stored. Typically, the dirtiest block of the array 10 is chosen for erasure. This allows the smallest amount of data to be moved out to another block of the array since the invalid data need not be moved. Once the valid information is written to another block and the new addresses are recorded in the lookup table 17, the block from which the information was read is erased. It is then placed back in operation as an entirely clean block. In order to allow this "cleanup" operation to occur, some number of blocks must be kept in reserve to be used when cleanup is necessary.

Figure 2:
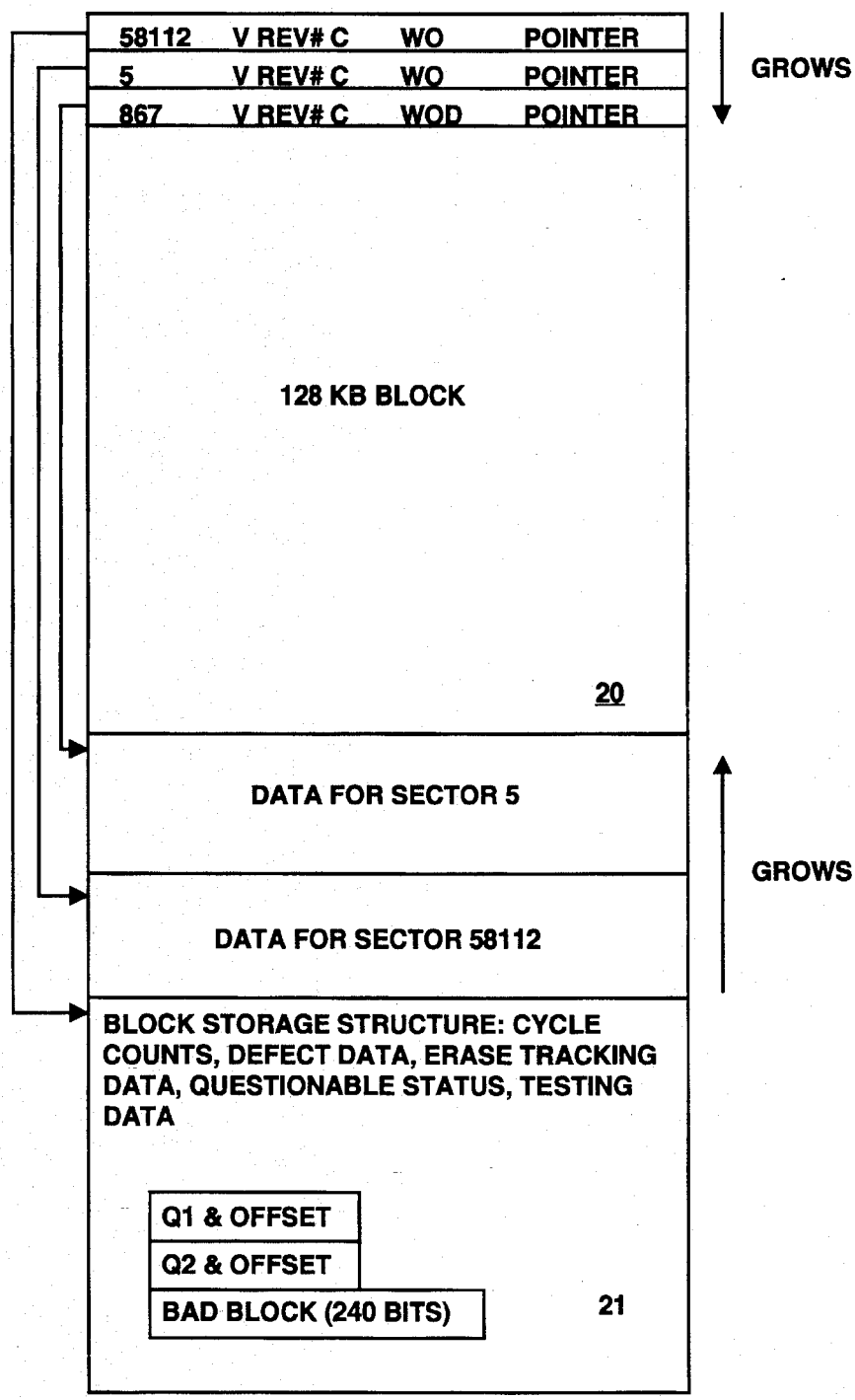
FIG. 2 is a block diagram illustrating a pattern for storage of information on a single block of a flash memory array such as that illustrated in FIG. 1.

FIG. 2 illustrates a logical arrangement used for an individual block in order to obtain the advantages discussed above. FIG. 2 is an idealized drawing useful in understanding the way data is stored on each block of the array 10. FIG. 2 illustrates a typical block 20 as a rectangle. The rectangular area includes a plurality of transistor devices arranged to provide the 128 K bytes of storage which each block provides. As mentioned previously, the area of an individual block is actually split between subblocks on two physical chips, one of which holds odd numbered bytes of data and one of which holds even numbered bytes of data. The individual transistors and the various column and row select lines and other conductors for operating the block are not illustrated but are well known to those skilled in the art of designing flash memory.

As may be seen in FIG. 2, data is stored in the block 20 beginning at the top of the block and close to the bottom. At the top of the block 20 are stored in identification fields called sector translation tables (or headers) the logical sector numbers used by the operating system as addresses for the data. For example, a first sector number 58112 is stored in the header for the first entry at the top. Following the sector number in each header are stored various attribute bits and a pointer value. The attributes included in one embodiment are an indication of the validity of the entry, a revision number, an indication whether the data is compressed or not, and a bit which indicates whether the entry includes data. The indication of the validity of the entry stores at least one bit which indicates valid when it is a one value and invalid when it is a zero value; this bit may be duplicated to better assure a correct validity is stored. The revision number is, in one embodiment, a four bit number. The bit which indicates whether the entry includes data or not is utilized to allow sectors to be created without data. Other information may also be stored in a header in a particular embodiment.

The pointer value points to a physical address on the block 20 (an offset from the beginning physical address on the block) at which the first byte of the data for logical sector 58112 is stored. An arrow in FIG. 2 illustrates this physical position at which the first byte of data for the logical sector 58112 are stored. Since the amount of data to be stored is known at the time of a write operation, in one embodiment of the block 20, the data is stored by writing down to the next previously stored data. In the case of logical sector 58112 which is the first sector on the block 20, the data is written commencing with the address stored as the offset associated with the sector number 58112 to a point at the beginning of the data area which is marked by a beginning pointer value illustrated by an arrow extending from the upper left hand corner of the block 20.

The amount of data written to the logical sector 58112 is not fixed and may vary. However, in the typical interface between the computer system and the storage system, data is assigned to storage in sectors of 512 bytes. FIG. 2 shows a second logical sector 5 and its pointer directed to a physical position on the block 20 which stores the first byte of the data for sector 5. The data for sector 5 is stored in an area which begins just above the most recent data sector written (sector 58112) and extends downward so that the last row of the new data sector lies in the row just above the first row of sector 58112. Since the data for each new sector is written in all of the rows immediately above the data for the last-written sector, only a trivial amount of data space (averaging one byte) is wasted in the block storage scheme of the arrangement. When the data being sent to storage is compressed, the amount of storage space normally left empty in a fixed size storage arrangement may be eliminated. This should be contrasted with the very large amount of unused space typical to an apparently full hard disk.

The data stored in any sector of the block 20 may be retrieved by going to the header for the sector and retrieving the pointer to the beginning position of the data and the pointer to the beginning position of the sector whose number is stored immediately preceding the sector number being retrieved. These two values determine the starting and ending positions for the data which is sought in the sector. As was pointed out above, the logical sector number is stored in a lookup table 17 (which in one embodiment is held in static random access memory 16 on the silicon chip which holds the other components of the array 10) with the physical position of the header including the chip number, the block, and the header offset value. This lookup table is maintained by the microprocessor of the control circuit 14.

FIG. 2 also shows the header for a sector 867. This sector is written without data (WOD).

The unusual arrangement for rewriting data used by a flash memory array requires that the memory allocation system continually make new or newly-erased free memory space available for data to be written and rewritten. This requires that some number of blocks always be available in order to allow blocks holding dirty data to be cleaned up and their dirty sectors released.

A problem which occurs in the operation of any memory array is that attempts to read, write, and erase that memory sometimes fail. Failures may occur for many reasons. Some of these failures may be due to the physical failure of the array while others are caused by some form of extraneous signal. Failures of an array which reoccur and cause the array not to write, read, or erase correctly cannot be tolerated; and the offending portion of the array must be removed from operation. On the other hand, extraneous errors which do not repeat do not require this result.

With typical electro-mechanical hard disks, a test is run before a disk is placed in operation to determine if bad sectors exist. Those sectors which are found are marked as bad in a table recorded on the disk. Since a flash memory array utilizes logical sectors which vary in size and physical location from sector to sector and cleanup to cleanup, such a method of marking would be very difficult to implement. Consequently, if a portion of an array is found to be producing repeating errors, the entire block of the array should be removed from operation. This creates a difficult situation since it reduces the number of blocks of the array which are available for the cleanup of dirty blocks. Consequently, especially conservative processes for correcting operational errors must be implemented to preclude removing blocks from the array unnecessarily.

Failures which can take place in the operation of a flash memory array may be of different types. This invention is concerned with two types of failures. A first type of failure which a block memory may experience is a data bit failure occurring during a read operation. Such a failure may be due to the physical condition of the array, or it may be caused by some form of non-repeating error. A second type of failure may be a failure of the flash memory to program when a write or an erase operation is attempted.

A data bit failure occurring during a read operation the data from which can be corrected should not cause a block to be removed from the array because the manner in which the array functions requires that there be a number of extra blocks ready to receive data as dirty blocks are cleaned up. Without these extra blocks, the array could fill and be unable to provide space for new or updated data as that data appears.

Figure 3:
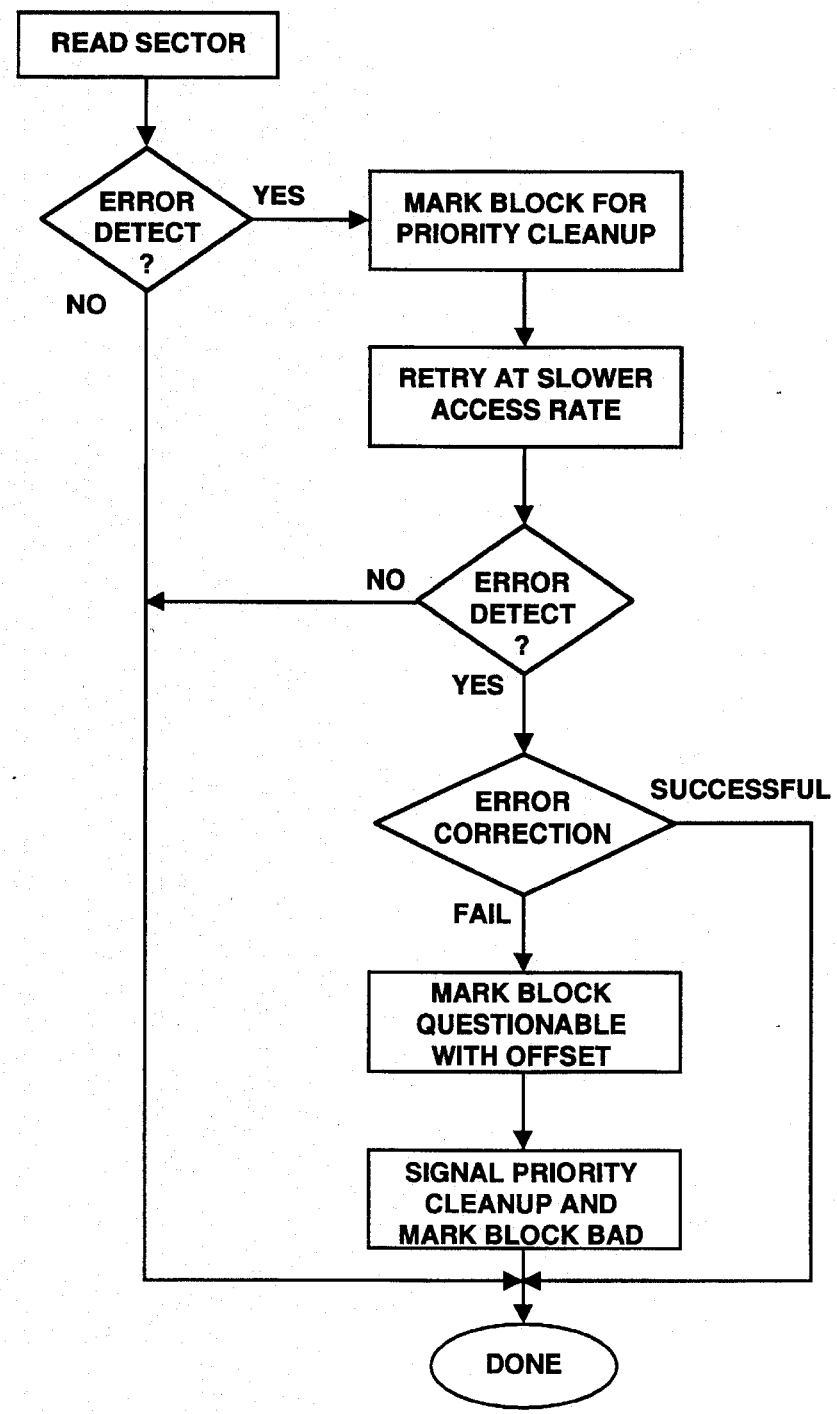
FIG. 3 is a flow chart illustrating a method in accordance with the present invention for handling a first type of apparent failures of the memory cells in a flash memory array.

FIG. 3 illustrates a process carried out in response to the detection of a read error. Typically, although not necessarily, such a process is implemented in software and carried out by the microprocessor which is a part of the controller 14. Typically, the process is stored in ROM which is a part of the controller 14. The process of FIG. 3 is predicated upon the need to keep as much memory as possible available for the array. The process begins at a first step at which an attempt is made to read data from a sector. The entire sector is read, and then the data is transferred to an error detection circuit which is part of the control circuit 14. The error detection circuit utilizes four bytes of error detection and correction code stored with the data in the sector to detect whether an error has occurred. In one embodiment of the invention, the error detection and correction code allows detection of single and multiple bit errors.

Examples of error detection and correction code and the operations which may be performed using such code are detailed, for example, in *Practical Error Correction Design For Engineers*, Revised 2d Edition, Glover and Trent, published by Cirrus Logic Press, copyright 1990.

Figures 6, 7:
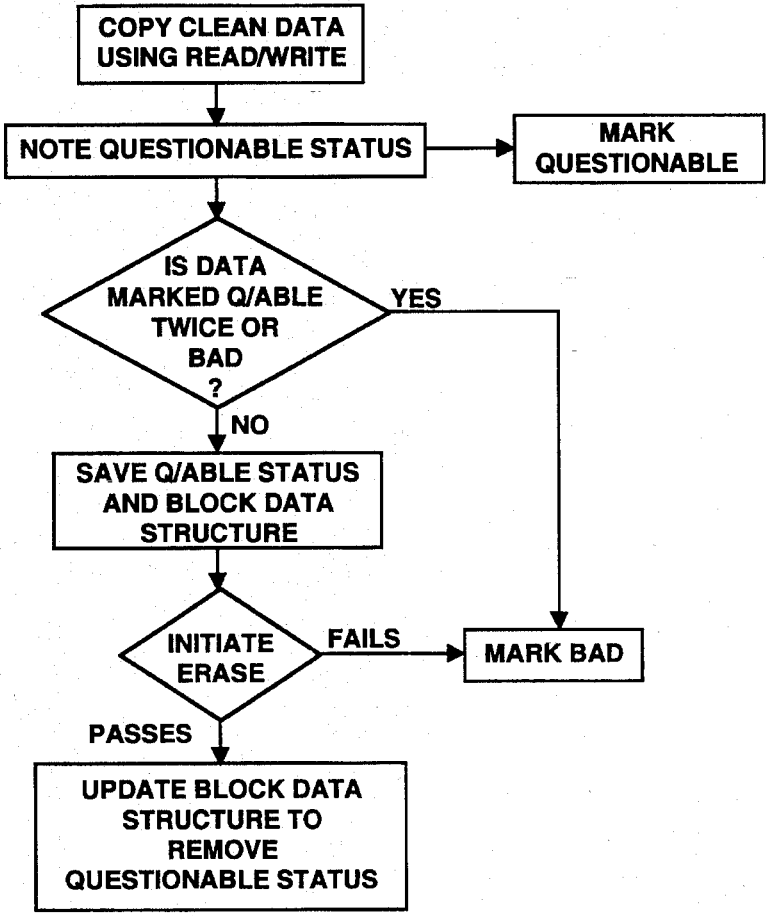
FIG. 6 illustrates a basic method of error detection and correction which may be utilized to correct errors.
FIG. 7 is flow chart illustrating a method in accordance with the present invention for handling the cleaning up of apparent failures of memory cells discovered using the processes of FIGS. 3 and 4 in a flash memory array.

FIG. 6 illustrates a basic method of error detection and correction which may be utilized to correct errors. This method is shown for illustration purposes only in order to better explain detecting and correcting errors in row and column organized memory arrays; the particular error detecting and correcting code utilized is not important to the present invention. For this purpose, only four rows and four columns of memory cell positions are shown. The method utilizes a parity checking arrangement in which each row and each column are assigned values depending on whether the total of bits which have one values stored in the particular row or column is an even or odd number. If the total of one values is odd as in the first, third, and fourth rows, a one is stored to bring the value to an even number. If the total is even as in the second, third, and fourth columns, a zero is stored so that the total remains an even number. These error checking bits are generated from the data as it is written and are typically stored in the sector with the data as the data is written. In one embodiment of the invention, four bytes of this type of error detecting and correcting data are stored with each sector of data. When the data is read from the sector, the parity check bits may be checked against the values of the data read. It will be seen that if a single bit error has occurred, the parity bits for a single column and a single row will not match the total of the values read. For example, if the one value stored at the intersection of the third row and the third column is read as a zero, then the parity value for the row will be zero while the stored parity bit for the row is one; and the parity value for the column will be one while the stored parity bit is a zero. These two failures during an error checking comparison detect that the bit at the intersection is incorrect and will allow that bit to be corrected to the proper one value.

Once the error detection step in FIG. 3 has taken place, if no error has occurred, then the process immediately steps to a done condition and no further steps are required. The data read from the sector may be utilized by the host.

If an error is detected during the error detection step, the process moves to a step at which the block is marked for cleanup so that the valid data will be moved to another block and the block will be erased on a priority basis. The marking is accomplished by the generation of a signal by the error detection circuitry which informs the read defect process of the detection of the error. The read defect process then generates a signal which is used to mark a cleanup data structure kept by the microprocessor of the control circuit 14 for the cleanup process in the random access memory 16. The data structure indicates the address of the particular block and that the particular block is to be cleaned up on a priority basis. The cleanup process signals that it has received the signal and will attend to it whenever that process is activated. The cleanup process is described in detail in U.S. patent application Ser. No. 07/969,760, filed Oct. 30, 1992, entitled *A Method Of Cleaning Up A Solid State Memory Disk Storing Floating Sector Data*, S. Wells, filed on even date herewith, and assigned to the assignee of the present invention.

After marking the block for priority cleanup, the process moves to a step at which an attempt is made to reread the data in the sector. This attempt is made at a much slower rate than is the first attempt. The reason for attempting to reread the information at a slower rate is that it has been discovered that some great portion of the errors which occur in attempting to read from a block in a flash EEPROM memory array are caused because, after some number of switching operations, it simply requires a longer period for a signal produced by a memory cell to settle to a level so that the data may be read. The data is perfectly good and may be read from the sector if a method is found to slow the read operation for such a sector. A circuit for automatically accomplishing a slow read operation when a read error is detected is disclosed in U.S. patent application Ser. No. 07/969,756, filed Oct. 30, 1992, entitled *Method and Apparatus To Improve Read Reliability in Semiconductor Memories*, S. Wells et al, filed on even date herewith, and assigned to the assignee of the present invention. If on such a retry of the read operation the information is read without error, the process is finished; and the error is considered to be non-repeatable and is simply ignored. Because of the built in process for slowing the read operation, data may continue to be written to and read from the area of the array. Since no loss of data will occur using this area and the block with the error is already marked for a priority cleanup, the block is left as an operating portion of the array.

If, however, a second error occurs on the attempt to reread, it is then known that the error is not one which a slower read operation will cure. Consequently, the process moves to a step at which a software error correction process run on the microprocessor of the control circuit 14 attempts error correction using the four bytes of error detection and correction data stored with each sector of information. The correction may be carried out in a manner which is well know to the prior art and is detailed in general above. As pointed out, this four bytes of information allows the correction of single and multiple bit errors which may occur in the attempt to read the particular sector. If the correction is successful, the process is complete.

This result which leaves the block in service is believed to be a correct result for actual bit errors where the process has been able to recover the data because the error is one which is correctable (from which data may be recovered), the storage area of the block is extremely valuable to the overall operation of the array, and complete erasure by the priority cleanup already marked may cure the defect entirely.

If, however, the error correction operation fails and the data cannot be recovered, this indicates that the type of error is not a single or multiple bit error for which the correction code and circuitry can be expected to produce valid data. Consequently, the correction circuitry generates a signal indicating the failure to correct. An area of the block allocated to the data structure on the block is illustrated as 21 in FIG. 2 at the bottom of the rectangle which constitutes the block. The signal causes the read process to generate a signal to mark a four byte questionable status area in the portion 21 of the faulty block to indicate that the block has failed. The signal also causes the read process to generate a signal to the cleanup data structure used by the cleanup process to both mark the block for priority cleanup and then, after the cleanup, to mark the block as bad. This has the effect of alerting the background cleanup operation to move the valid data from the block and finally mark the block as bad and not to be used.

In one embodiment of the invention, a block is marked bad by placing an indication in a 240 bit space of the block data structure of block zero of all of the chips making up the array. This space resides in the same area of the block allocated to the data structure on each block which is illustrated as 21 in FIG. 2 at the bottom of the rectangle which constitutes the block. This marking of all block zeroes stores the indication that a block is bad in an area apart from the block which is bad (and which may therefore not be relied upon to correctly store the indication of its faulty condition). Polling by the controller 14 of this area of the block data structure of all block zeroes on all of the chips and using a majority to indicate whether a particular block is bad or not provides an accurate indication of the status of any block. The polling is accomplished on system power up by scanning the bad bit space (240 bits are allocated for the 240 blocks) of each block zero and counting the number of bad block indications for each block; a number greater than some preset number (a majority, for example) will indicate that the block is bad.

Figure 4:
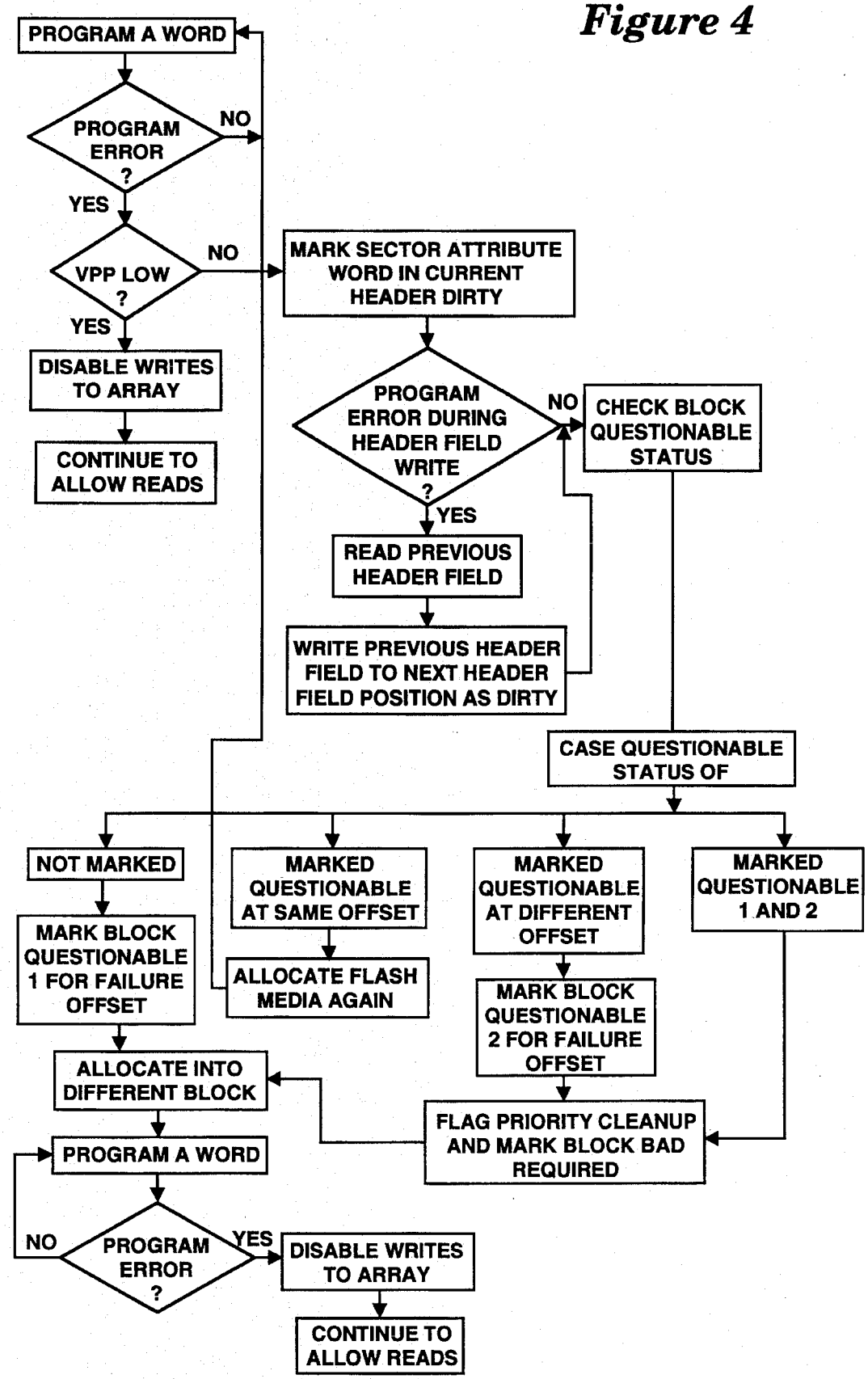
FIG. 4 is a flow chart illustrating a second portion of a method in accordance with the present invention for handling a second type of apparent failures of the memory cells in a flash memory array.

FIG. 4 illustrates a process for handling the operation of the circuitry of the array in a situation in which an error occurs during an attempt to write to a sector of a block of the array. It should be noted that, in contrast to the process practiced when writing to typical memory arrays such as electro-mechanical hard disks, each word of data written to the array is checked by the write state machine of the array 10 as it is written to determine whether the operation was correctly performed. A similar check is implemented whenever a block of the array is erased to assure that a proper erase operation has occurred. In each of these operations, the data written to the array (one values in the case of an erase) is compared to the data stored in the array after the write operations has taken place. The details of such an operation are disclosed in the patent application entitled *Circuitry and Method for Programming and Erasing a Non-Volatile Semiconductor Memory,* referred to above.

On each attempt to write to the array, a comparison check is made to determine whether an error has occurred. If no error has occurred, the process is complete and the next word is written. If an error has occurred, the process moves to a step at which a test is made to determine whether the programming voltage has failed: programming and erase require a higher voltage than do other functions associated with the array. If the programming voltage has failed, the entire array is disabled for write and erase operations which require the high voltage; but read operations which do not require this voltage are allowed. Typically, the programming voltage will be available when power is again furnished to the system.

If the comparison shows that a programming error occurred but that programming voltage is available, the particular sector to which the write operation was attempted is marked dirty at the validity bit(s) of the attributes field of the header so that the data will not be used by the host.

The process next moves to a step at which it determined whether the error occurred during the writing of the header information rather than during the writing of data to the data portion of the logical sector. If the data is bad, a general type of response which is described below is undertaken. However, if the error in writing occurs during the writing of header information, the offset indicated by the pointer value may be bad. It will be recalled that the actual size of the sectors may vary so two pointers are necessary to determine the data in each sector. Since this pointer is used for retrieving data from both the sector being written and the following sector in accordance with the scheme above described, its failure means that the data in the sector cannot be reliably recovered and that pointers to the data in all sectors which are written following the failed sector cannot be considered to be reliably positioned.

The process of the present invention provides a method for overcoming this problem. If the error occurs during the writing of a header (which occurs before the data is written), a questionable signal is generated for the sector; the use of this signal is discussed below. Then, the preceding header is read. This preceding header is then written to the next succeeding header position on the block and is marked dirty. This duplicate header includes an accurate offset value (pointer) from which a next succeeding sector may be written. This allows additional sectors to be written to the block. The accurate pointer in this duplicate header points back to the end of the previous sector which includes the write error. Thus, when a next sector is written to the block, it will be written to end at the data space on the block at which the last good sector was written. This not only provides an accurate pointer for additional sectors but also assures that the data space previously assigned to the sector with the header write error but not written is not lost to storage.

Whether the error in the attempt to write occurred in the header or in the data area, the process then checks to determine the status of the block in the block status area. The block to which the attempt to write was made may already be marked as questionable in the four bytes allocated to this purpose in the block status area, and the process reviews the questionable bytes in the status block to determine this. In one embodiment, two bytes are allocated to a first questionable marking (Q1), and two additional bytes are allocated to a second questionable or failed marking (Q2). Each such questionable marking includes the offset number of the faulty sector so that the position may be determined. In one embodiment of the invention, these questionable bytes are also stored in the random access memory 16 so that the controller 14 may determine that a block holds data which is questionable without going to the block status area on the block being written. It is also possible for a single bit for each block to be stored in RAM 16 instead of the entire four bytes. This allows the controller 14 to review a small data structure in RAM 16 during a failed write to determine if the block has any questionable data before determining the actual position of that data in the block status area.

If the block has not already been marked questionable, it is marked as questionable on the block in the questionable table of the block status area by marking the first two Q1 bytes and indicating the offset of the error.

This immediate marking of a block as questionable may seem a very rapid conclusion that the block may be operating incorrectly; but, in the arrangement of the array, the circuitry by which a write is attempted will have automatically retried the write operation a plurality of times in response to the single write command. The details of this write operation are described in the U.S. patent application entitled *Circuitry and Method for Programming and Erasing a Non-Volatile Semiconductor Memory*, referred to above. Consequently, the single host write command which has produced a failure to write has actually initiated a plurality of write attempts and further attempts would be superfluous.

The process then moves to allocate new free space for the write operation in another block. An attempt is made to write the entire sector to the free space allocated, and does so if no error occurs. However, if an error occurs, this new block is not marked questionable. The error is assumed to be a general hardware error of the system because two errors have occurred during attempts to write the same data to different blocks. Consequently, write and erase operations are disabled; and only read operations are allowed.

However, if this is not the first questionable marking and the block was already marked as questionable at this particular offset, the process discovers this is its review of the questionable table in the status block. The block is not marked questionable a second time; the process simply allocates another portion of free flash memory space and attempts the write operation again. The sector has already been marked dirty in its attribute table and will ultimately be cleaned up; and the block has already been marked questionable in the block status area for this offset. By this process, redundant errors at a single location are tolerated.

If the process discovers upon the review of the questionable table that the block has already been marked questionable once at an offset different than that of the present error, then the process marks the block as questionable a second time in the Q2 portion of the block status area with the offset of the second marking. This accumulation of two questionable marks indicates that the block has failed and causes the write defect process to signal the cleanup process (using the cleanup data structure) for a priority cleanup operation and to mark the block bad after the cleanup in the block status areas of all the zero blocks. The process then allocates new free space to the sector and proceeds through the steps described for the block not already marked. In these steps, the process attempts to write the sector of data to a different set of chips of the array. If this is successful, the process is complete. If it is not successful, then the second block is not marked questionable; but the entire array is disabled for further write and erase operations. This occurs because it is most probable that it is not the flash blocks which are at fault but some other portion of the array or its associated circuitry.

If the process discovers upon the review of the questionable table that the block has already been marked questionable twice, it simply generates the signal to the cleanup process for a priority cleanup and for marking the block bad in the block status area of block zero on each chip, then reallocates space for the write operation and moves to attempt the write to the new space as just explained.

Figure 5:
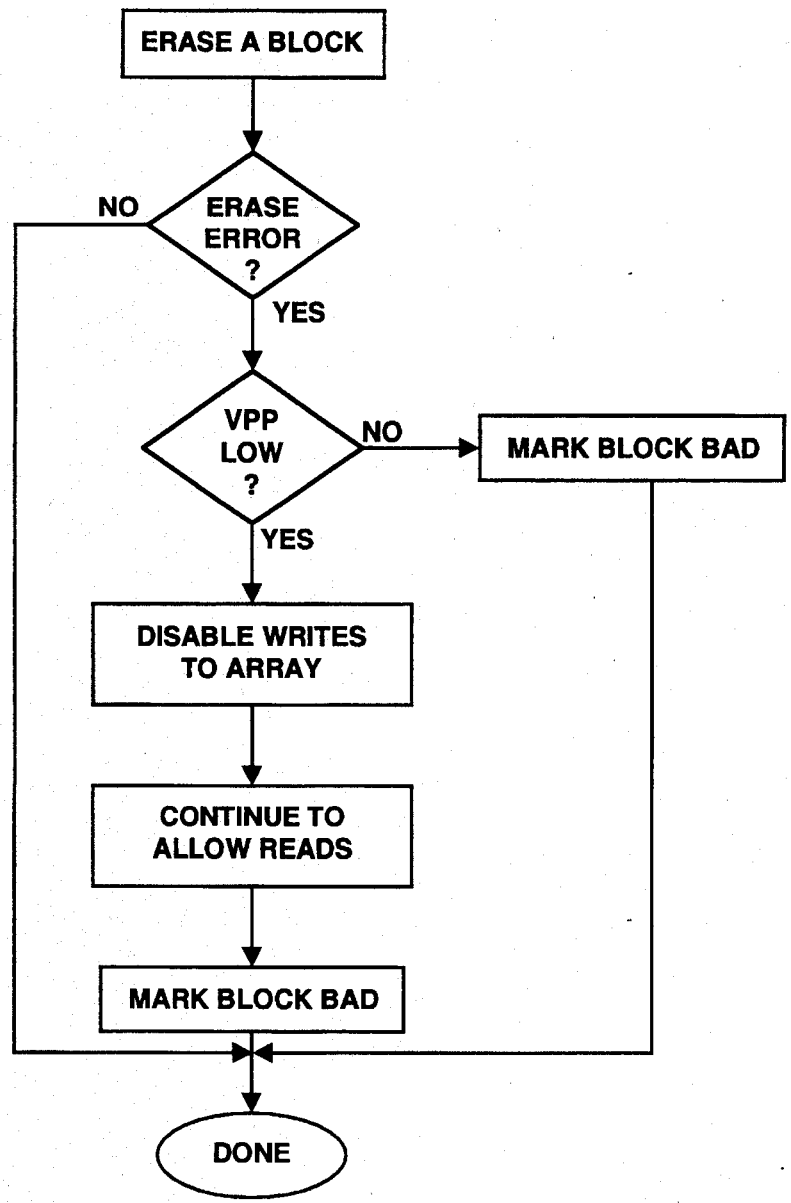
FIG. 5 is a flow chart illustrating a method in accordance with the invention for handling defects encountered during an erase operation.

FIG. 5 is a flow chart illustrating a method in accordance with the invention for handling defects encountered during an erase operation. The process may also be implemented in software stored in the read only memory of the controller 14. The process is essentially like that at the beginning of the write defect management process. On each attempt to erase the array, a comparison check is made to determine whether an error has occurred. If no error has occurred, the process is complete and the next word is written. If an error has occurred, the process moves to a step at which a test is made to determine whether the programming voltage Vpp has failed. If the programming voltage has failed, the entire array is disabled for write and erase operations which require the high voltage; but read operations which do not require this voltage are allowed. Typically, the programming voltage will be available when power is again furnished to the system.

If the comparison shows that an erase error occurred but the programming voltage is available, the erase process generates a signal to the cleanup process indicating that the particular sector on which the erase operation was attempted is to be marked bad. The erase defect management process is then done.

FIG. 7 illustrates a process run by the microprocessor of the control circuit 14 whenever the cleanup process is run to clean up blocks which are bad or questionable. The cleanup process occurs whenever a block is to be erased so that the excess memory available in its dirty sectors may be released for use by the system. The details of the selection of particular blocks to be cleaned up and the particulars of reading the data and writing to free space which are accomplished by the cleanup process are disclosed in the U.S. patent application entitled *A Method Of Cleaning Up A Solid State Memory Disk Storing Floating Sector Data*, referred to above. In the first step of the process, the process reads all of the valid sectors stored on the block and writes those valid sectors, sector by sector, to unused areas in another block. During this operation, the process notes whether the block from which the data is being read has been marked questionable. If the block has either been marked questionable twice or has been marked for priority cleanup and to be marked bad, then the block is marked bad so that it will no longer be used for any read or write operations. If the block was not marked for priority cleanup (and to be marked bad) or marked questionable twice, the questionable status and the block data structure are saved; and an erase is attempted. If the erase fails, this failure causes the block to be marked bad since a block which cannot be erased cannot be programmed. If the erase operation is successful, the questionable status and the block data structure are restored to the erased block. The block is then placed back into service.

Using the processes of the present invention described above, it has been found possible to provide continually available blocks of memory for use while at the same time assuring the user of the integrity of the data stored therein.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for write defect management in a memory array divided into individually erasable blocks of memory, said method comprising the steps of:

generating a block status table for each block in each memory array;

executing a program operation with data to a block of memory at a first offset address;

determining whether an error occurred in said program operation to said block;

checking said block status table to determine whether a previous error occurred in said block if an error occurred in said program operation;

generating a first questionable indication for said block in said block status table including identifying said first offset address in said block if an error occurred in said program operation and if said block has no previous questionable indications at said first offset address;

allocating a new offset address in said block for said data if an error occurred in said program operation and if said status table indicates said block was previously marked questionable at said first offset address;

generating a second questionable indication for said block in said block status table if an error occurred in said program operation, and said block has a previous questionable indication but said block has no previous questionable indications at said block offset address; and marking said block bad if an error occurred in said program operation and if said block has two previous questionable indications; and allocating a new block for said data if an error occurred in said program operation.

2. The method as set forth in claim 1, further comprising the steps of:

determining whether a high programming voltage is low if an error occurred in said program operation;

disabling write operations to said memory array if said high program voltage is low; and executing, upon request, read operations to said block.

3. The method as set forth in claim 1, wherein the step of determining whether an error occurred in said program operation to said block comprises the steps of:

determining whether an error occurred in said program operation when programming a header field;

reading a previous header field in said block if said program operation error occurred when programming a header field;

writing said previous header field data to a subsequent header position in said block; and marking said previous header field dirty.

4. The method as set forth in claim 1, further comprising the steps of:

executing a second program operation for said data to a second block if an error occurred in said program operation;

determining whether an error occurred in said second program operation;

disabling write operations to said array if an error occurred in said second program operation; and executing, upon request, read operations to said array.

5. The method as set forth in claim 1, wherein the step of marking said block bad if an error occurred in said program operation and if said block has two previous questionable indications further comprises the steps of:

flagging said block for a priority cleanup; and marking said block bad.

6. The method as set forth in claim 1, wherein the step of executing a program operation further comprises the steps of:

generating a plurality of header fields in a first area of said block for data entries;

generating a block storage structure for said block; and programming data corresponding to said data entries between said header fields and said block storage structure.

7. The method as set forth in claim 6, wherein the step of generating a header field in said block for said data comprises the steps of:

identifying a sector number for said data entry, said sector number being utilized by an operating system to address said data;

identifying whether said data entry is valid;

identifying a revision number for said data entry;

identifying whether said data entry includes valid data;

identifying whether said data entry is compressed; and identifying a pointer for said data entry including an offset address to specify a location in said block for said data entry.

8. A method for read defect management in a memory comprising a plurality of memory arrays divided into individually erasable blocks of memory, said method comprising the steps generating a bad block status area on said array;

executing a read operation to a block at an offset address to retrieve data stored in said block;

determining whether an error occurred in said read operation to said block;

signaling a priority clean-up for said block;

marking said block bad in said bad block status area after priority clean-up for said block;

polling said bad block status area on said array to determine a status for any block in said array such that determination of bad blocks on said array is readily ascertainable;

generating a questionable status table on said array;

marking said block questionable in said questionable status table including identifying said offset address if an error occurred in said read operation to said block;

executing an erase operation on said block if marked questionable twice including saving said questionable status table; and marking said block bad in said bad block status area if said erase operation fails; and removing said questionable status of said block if said erase operation is successful.

9. The method as set forth in claim 8, further comprising the step of executing said read operation again at a slower speed if an error occurred in said read operation.

10. The method as set forth in claim 8, further comprising the step of performing error correction on said data retrieved in said read operation.

* * * * *

UNITED STATES PATENT AND TRADEMARK OFFICE
CERTIFICATE OF CORRECTION

PATENT NO. : 5,473,753
DATED : December 5, 1995
INVENTOR(S) : Wells et al.

It is certified that error appears in the above-identified patent and that said Letters Patent is hereby corrected as shown below:

In column 15 at line 42 delete "block" and insert --first--

In column 16 at line 47 insert --of:-- following "steps"

Signed and Sealed this

Fifteenth Day of July, 1997

Attest:

BRUCE LEHMAN

Attesting Officer    Commissioner of Patents and Trademarks